(12) United States Patent
Kim

(10) Patent No.: US 6,946,783 B2
(45) Date of Patent: Sep. 20, 2005

(54) SHADOW MASK AND FLAT DISPLAY FABRICATED BY USING THE SAME AND METHOD FOR FABRICATING THE SAME

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 43 days.

(21) Appl. No.: 10/411,200

(22) Filed: Apr. 11, 2003

(65) Prior Publication Data

US 2003/0193285 A1 Oct. 16, 2003

(30) Foreign Application Priority Data

Apr. 12, 2002 (KR) .................................. P 2002-20102

(51) Int. Cl.⁷ ................................................ H01J 29/80
(52) U.S. Cl. ..................... 313/402; 313/403; 313/461
(58) Field of Search ................................ 313/402, 403, 313/461, 463, 466, 473

(56) References Cited

U.S. PATENT DOCUMENTS

| 4,996,458 A | * | 2/1991 | Hattori et al. | 313/402 |
| 6,175,185 B1 | * | 1/2001 | Aibara | 313/402 |

* cited by examiner

*Primary Examiner*—Vip Patel
(74) *Attorney, Agent, or Firm*—Fleshner & Kim LLP

(57) ABSTRACT

Shadow mask, flat display fabricated by using the same, and method for fabricating the flat display, the shadow mask including a substrate, a plurality of via holes formed in the substrate on a plurality of rows, inclusive of first via holes on odd numbered rows, and second via holes on even numbered rows, wherein the first via holes are arranged to straddle the second via holes, and bridges formed between the first via holes, and between the second via holes, thereby improving an aperture.

25 Claims, 9 Drawing Sheets

SHADOW MASK AND FLAT DISPLAY FABRICATED BY USING THE SAME AND METHOD FOR FABRICATING THE SAME

This application claims the benefit of the Korean Application No. P2002-20102 filed on Apr. 12, 2002, which is hereby incorporated by reference.

BACKGROUND OF THE INVENTION

1. Field of the Invention

The present invention relates to a shadow mask, and more particularly, to a shadow mask for improving aperture of a flat display, a flat display fabricated by using the same, and a method for fabricating a flat display.

2. Background of the Related Art

In general, in fabrication of a full color organic electroluminescent (EL) display, the shadow mask is used for forming R, G, B pixels with good color senses and luminous efficiencies.

Figure 1A:
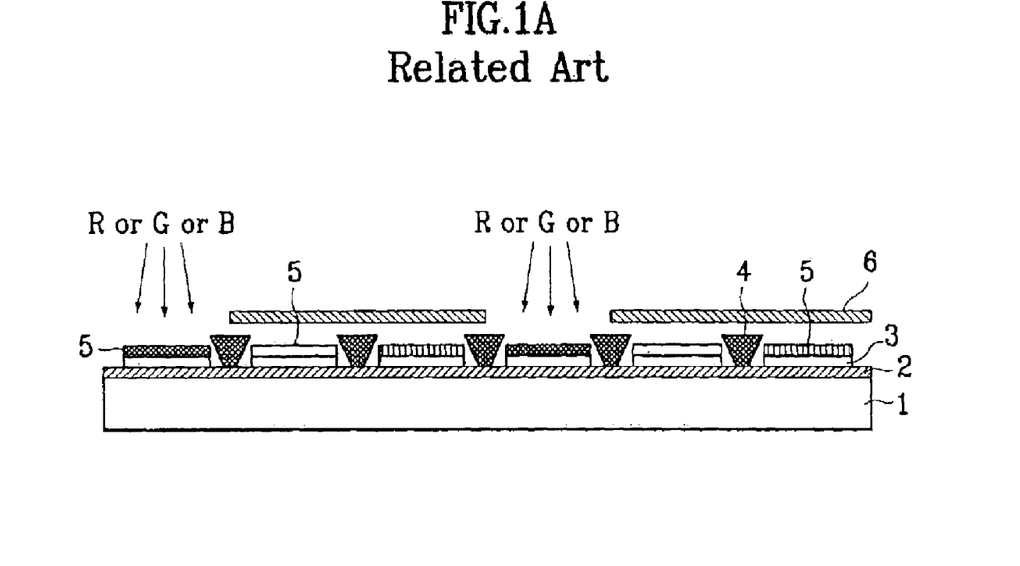
FIG. 1A illustrates a section showing a process of forming an organic EL layer of a full color organic EL display by using a related art shadow mask.
Figure 1B:
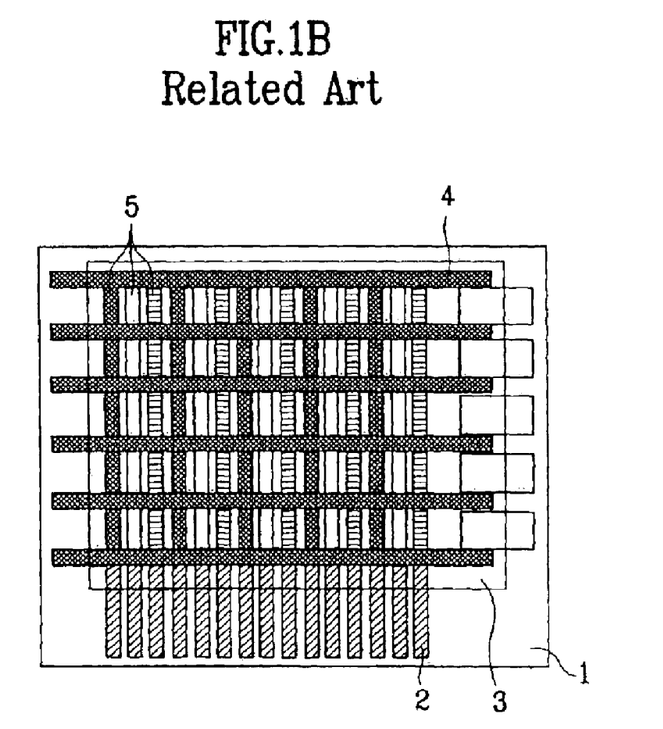
FIG. 1B illustrates a plan view of the organic EL layer of the full color organic EL display formed by FIG. 1A.

A related art method for fabricating the full color organic EL display having the shadow mask applied thereto will be explained, with reference to FIGS. 1A, 1B, and 1C.

At first, anode strips 2 are formed on a glass substrate 1. Then, an insulating film 3 and barriers 4 are formed on the anode strips 2 perpendicular thereto. R, G, B organic EL layers are formed on R, G, B pixels 5 respectively by using a shadow mask 6 as shown in FIG. 1C. Finally, a cathode strip (not shown) is formed between every barrier 4, to finish the full color organic EL display.

Figure 1C:
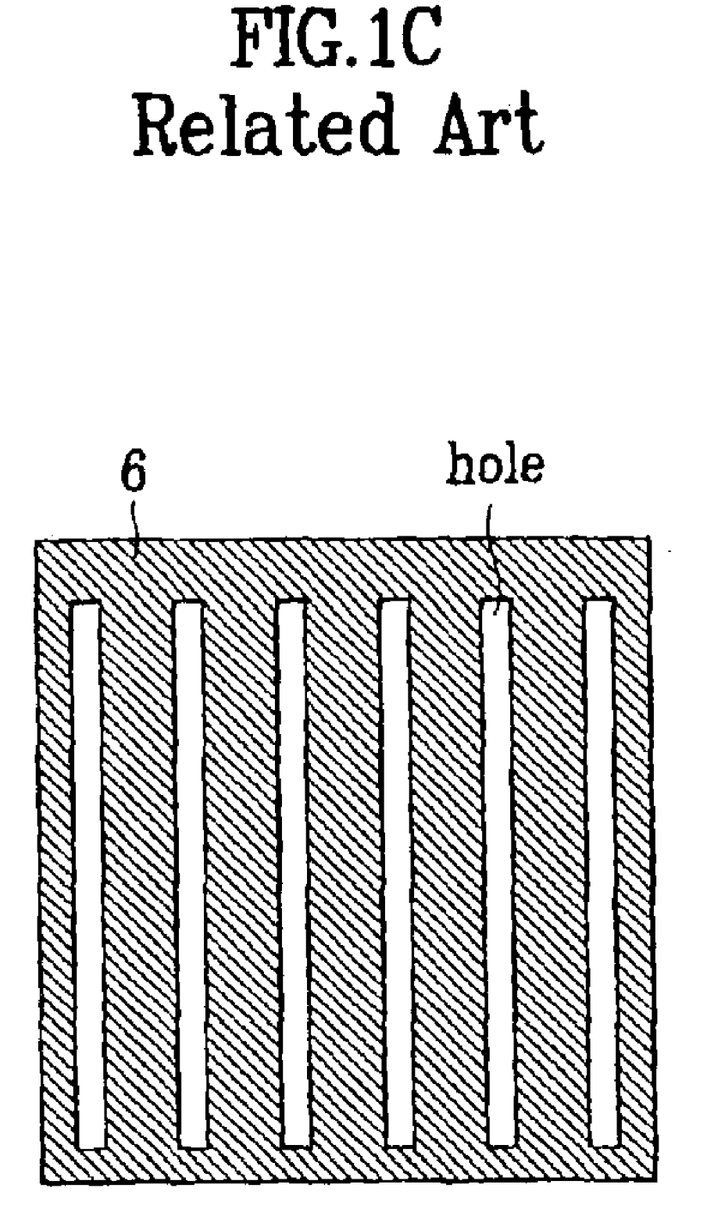
FIG. 1C illustrates a plan view of the shadow mask in FIG. 1A.

However, since the shadow mask 6 as shown in FIG. 1C has strip forms of openings therein, the shadow mask is liable to deform by an external force, and sag. The deformation and sagging of the shadow mask causes failure in formation of pixel regions on which the organic EL layers are to be formed in fabrication of the full color organic EL display.

SUMMARY OF THE INVENTION

Accordingly, the present invention is directed to a shadow mask, a flat display fabricated by using the same, and a method for fabricating the flat display that substantially obviates one or more of the problems due to limitations and disadvantages of the related art.

An object of the present invention is to provide a shadow mask which can prevent deformation and sagging caused by tension.

Another object of the present invention is to provide flat display having the shadow mask applied thereto, which has a great aperture and a simple fabrication process; and a method for fabricating the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the shadow mask for fabricating a flat display includes a substrate, a plurality of via holes formed in the substrate on a plurality of rows, inclusive of first via holes on odd numbered rows, and second via holes on even numbered rows, wherein the first via holes are arranged to straddle the second via holes, and bridges formed between the first via holes, and between the second via holes.

The via hole has a length in a row direction greater than a column direction, and the via hole has a size the same with a sum of sizes of two pixels of the display intended to fabricate.

A distance between the odd numbered rows and the even numbered rows adjacent thereto is a distance sizes of two pixels of the display intended to fabricate are summed, a distance between adjacent even numbered rows is a distance equal to a sum of sizes of five pixels of the display intended to fabricate, and a distance between adjacent odd numbered rows is a distance equal to a sum of sizes of five pixels of the display intended to fabricate.

The bridge prevents deformation of the substrate, and is formed of a metal.

The bridge may have a thickness the same with the substrate and is formed on the same plane with the substrate, or the bridge may have a thickness different from the substrate and is formed on a plane different from the substrate.

The bridge may include a first sub-bridge having a thickness the same with the substrate and is formed on the same plane with the substrate, and a second sub-bridge formed on the first sub-bridge and the substrate.

The bridge has a width and a thickness in a range of 1~1000 $\mu$m.

In another aspect of the present invention, there is provided a method for fabricating a flat display by using a shadow mask having first via holes on odd numbered rows, and second via holes on even numbered rows, wherein the first via holes are arranged to straddle the second via holes, and bridges formed between the first via holes, and between the second via holes, including the steps of providing a substrate, forming a plurality of first electrode strips on the substrate in parallel, placing the shadow mask such that the first, and second via holes are disposed opposite to, and over the first pixel regions on the substrate, and forming a first light emitting material in the first pixel regions on the substrate through the first and second via holes, shifting, and placing the shadow mask such that the first, and second via holes are disposed opposite to, and over the second pixel regions on the substrate, and forming a second light emitting material in the second pixel regions on the substrate through the first and second via holes, shifting, and placing the shadow mask such that the first, and second via holes are disposed opposite to, and over the third pixel regions on the substrate, and forming a third light emitting material in the third pixel regions on the substrate through the first and second via holes, and forming second electrode strips on the first, second, and third light emitting materials in a direction perpendicular to the first electrode strips.

When the shadow mask is placed on the pixel region, each of the via holes of the shadow mask is opposite to two pixels.

In further aspect of the present invention, there is provided a flat display fabricated by using a shadow mask having first via holes on odd numbered rows, and second via holes on even numbered rows, wherein the first via holes are arranged to straddle the second via holes, and bridges formed between the first via holes, and between the second via holes, including a substrate, a plurality of first electrode strips formed on the substrate in parallel, a plurality of second electrode strips in a direction perpendicular to the first electrode strips, and light emitting pixels containing light emitting materials formed in regions the first electrode strips and the second electrode strips cross, wherein the light emitting pixels formed in a direction of the first electrode strips are formed at different intervals, and the light emitting pixels formed in a direction of the second electrode strips are formed at the same intervals.

Each of the light emitting pixels formed in the direction of the first electrode strips has a distance to an adjacent light emitting pixel on one side thereof different from a distance to an adjacent light emitting pixel on the other side thereof.

The distance to an adjacent light emitting pixel on one side thereof in the direction of the first electrode strips is 1~1000 $\mu$m, and the distance to an adjacent light emitting pixel on the other side thereof in the direction of the first electrode strips is below 1 $\mu$m.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 2:
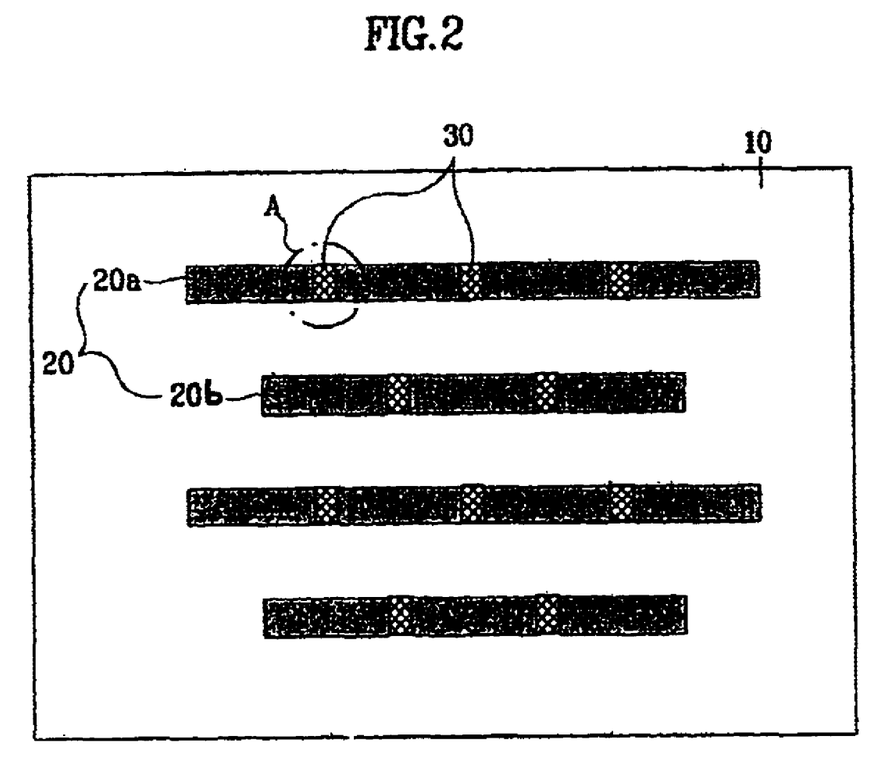
FIG. 2 illustrates a plan view of a shadow mask in accordance with a preferred embodiment of the present invention.

Reference will now be made in detail to the preferred embodiments of the present invention, examples of which are illustrated in the accompanying drawings. FIG. 2 illustrates a plan view of a shadow mask in accordance with a preferred embodiment of the present invention.

Referring to FIG. 2, the shadow mask includes a substrate 10, a plurality of via holes 20 arranged on a plurality of rows, and bridges 30 formed between the via holes The via holes 20 includes first via holes 20a on odd numbered rows, and second via holes 20b on even numbered rows, wherein the first via holes 20a are arranged to straddle the second via holes 20b. For preventing deformation of the substrate 10 caused by the via holes 20, the bridges 30 are formed of metal between the first via holes 20a, and between the second via holes 20b.

The via hole 20 has a row direction length greater than a column direction length. That is, one via hole 20 has a size of two pixels of a display intended to fabricate. A distance between odd numbered row and an even numbered row adjacent thereto is set to be a distance equal to a sum of sizes of two pixels, a distance between adjacent even numbered rows is set to be a distance equal to a sum of sizes of five pixels of the display intended to fabricate, and a distance between adjacent odd numbered rows is set to be a distance equal to a sum of sizes of five pixels of the display intended to fabricate.

Figure 3A:
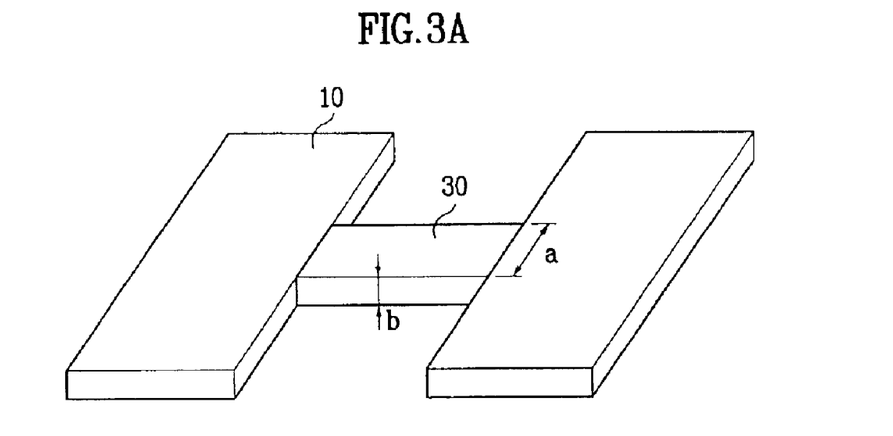
FIGS. 3A~3C illustrate bridges in accordance with preferred embodiments of the present invention.
Figure 3B:
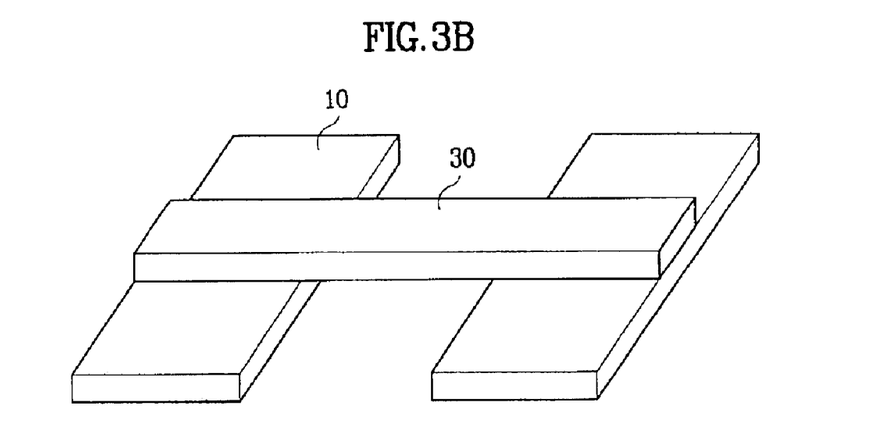
Figure 3C:
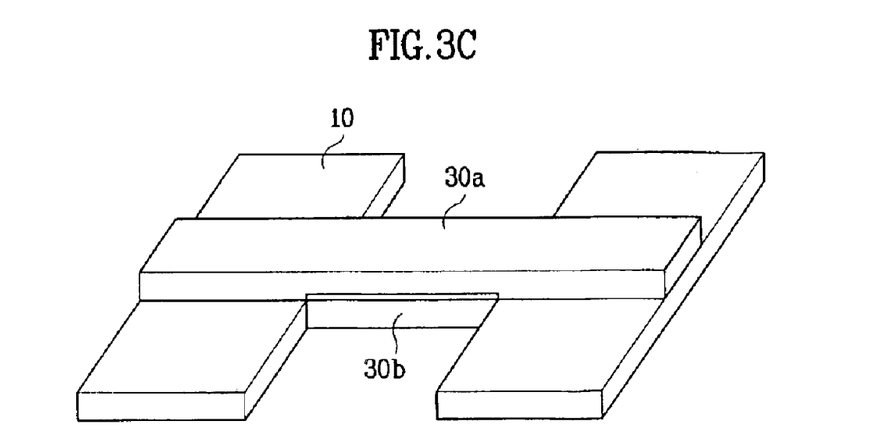

FIGS. 3A~3C illustrate the bridges shown in FIG. 2 ('A' part) in accordance with preferred embodiments of the present invention.

The bridge 30 shown in FIG. 3A has a thickness 'b' that is the same as the thickness of the substrate 10, and is formed on the same plane as the substrate 10. The bridge 30 shown in FIG. 3B has a different thickness than the substrate 10, and is formed on a different plane than the substrate 10. In this instance, the bridge 30 is formed on the substrate 10 and is thicker than the substrate 10.

The bridge 30 shown in FIG. 3C includes a first sub-bridge 30a having a thickness that is the same as the thickness of the substrate 10, and that is formed on the same plane as the substrate 10, and a second sub-bridge 30b formed on the first sub-bridge 30a and the substrate 10. The second sub-bridge 30b has a thickness equal to, or thicker than the first sub-bridge 30a.

It is appropriate that the bridge 30 of the shadow mask of the present invention has a width 'a' and a thickness 'b' to be approx. 1~1000 $\mu$m.

A flat display having an improved aperture can be fabricated easily by using the foregoing shadow mask of the present invention.

FIGS. 4A~4G illustrate plan views showing the steps of a method for fabricating a full color organic EL display by using a shadow mask in accordance with a preferred embodiment of the present invention.

Figure 4A:
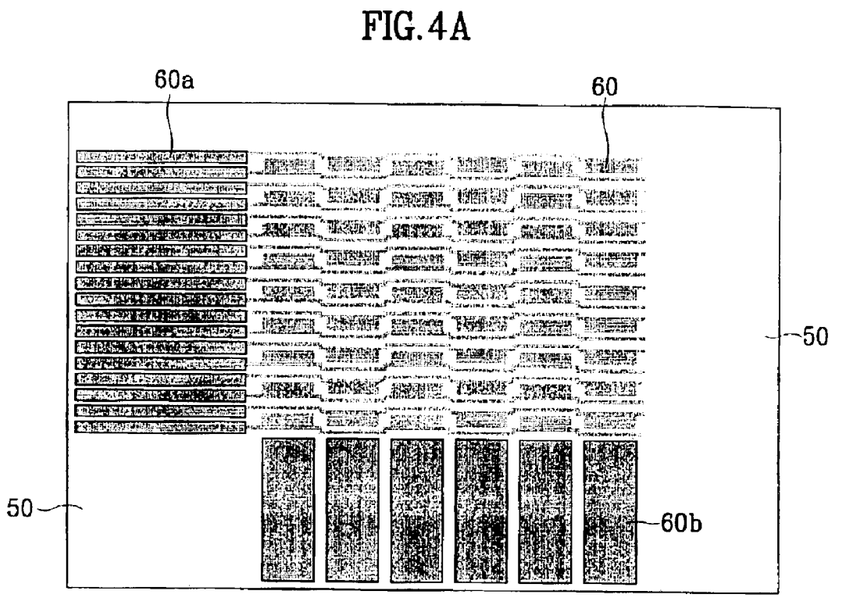
FIGS. 4A~4G illustrate plan views showing the steps of a method for fabricating a full color organic EL display by using a shadow mask in accordance with a preferred embodiment of the present invention.

Referring to FIG. 4A, a plurality of first electrodes 60 are formed on a transparent substrate 50 in parallel. The first electrodes 60 are formed in pixel regions, and electrically connected to each other. There are first electrode taps 60a connected to the first electrodes 60 on the substrate 50, and second electrode taps 60b for connection to second electrodes to be formed later.

Figure 4B:
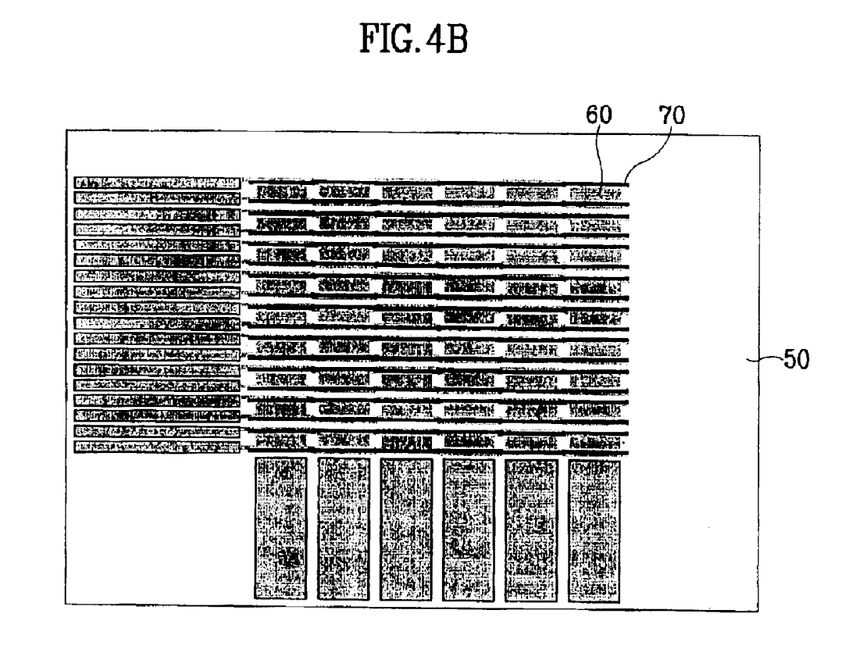

Referring to FIG. 4B, for reducing a resistance of the first electrode 60, a supplementary electrode 70 is formed on the first electrode 60. The supplementary electrode is formed of a metal having a resistance lower than the first electrode 60, such as Cr, Al, Cu, W, Au, Ni, Ag, and the like.

Figure 4C:
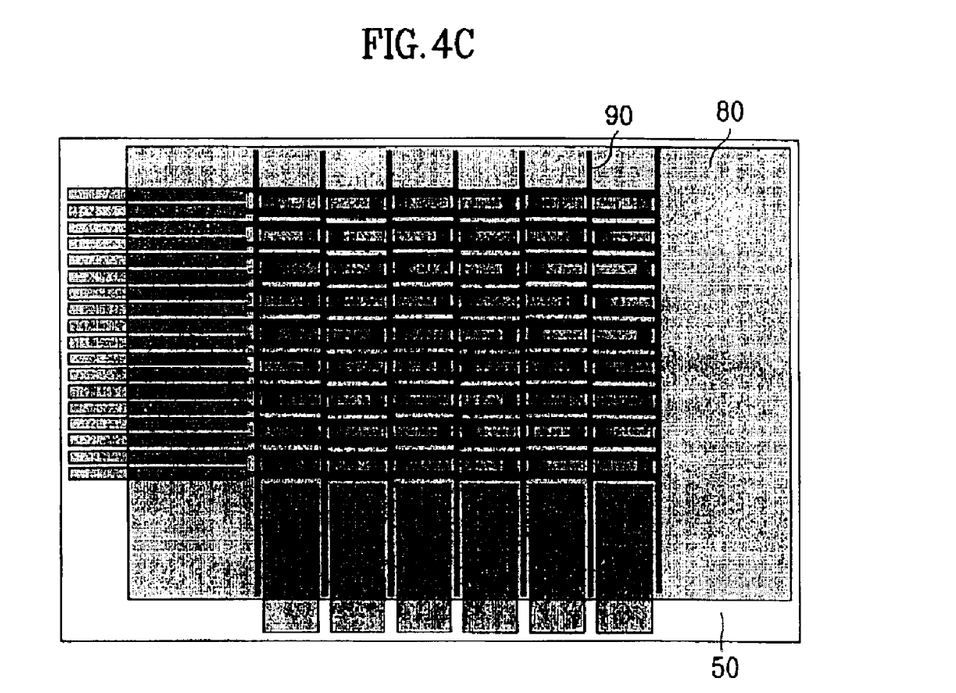

Referring to FIG. 4C, an insulating film 80 is formed on the transparent substrate 50 to cover an edge part of the first electrode 60. In formation of the insulating film 80, a size of the pixel is fixed. Then, barriers 90 are formed for insulation between pixels in a direction perpendicular to the first electrode 60.

Figure 4D:
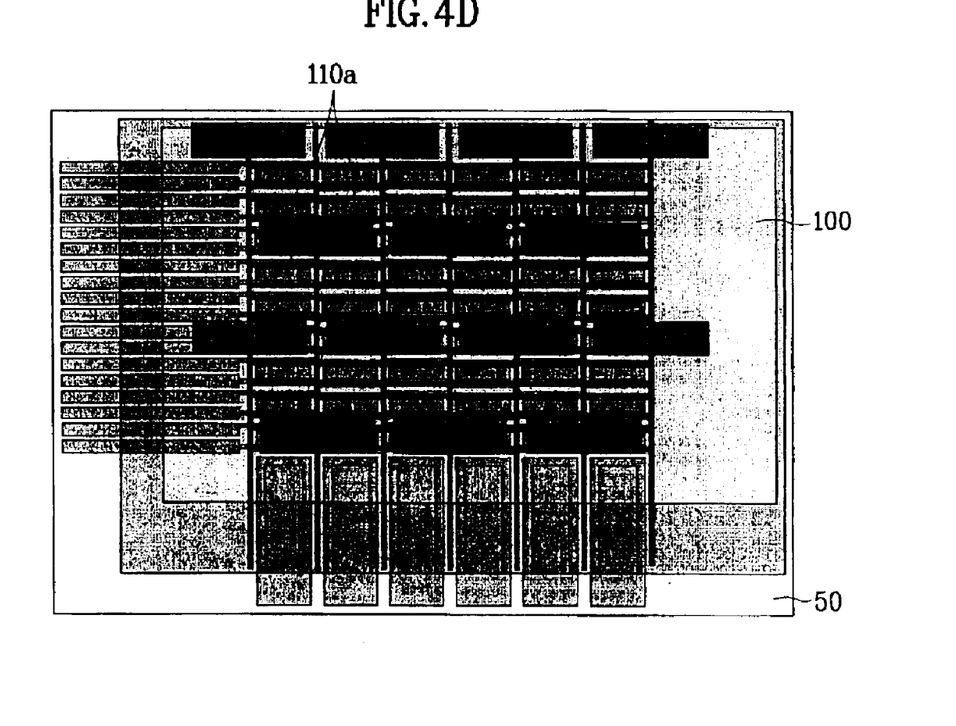

Referring to FIG. 4D, the shadow mask 100 shown in FIG. 2 is placed on the substrate 50 having the first electrode 60 formed thereon. When the shadow mask 100 is placed on the pixel regions, the shadow mask 100 is placed such that the via holes in the shadow mask 100 are opposite to two pixels. At first, the shadow mask 100 is placed such that the first and second via holes of the shadow mask 100 are opposite over the RED pixel regions. Then, a RED light emitting material is deposited on the RED pixel regions through the first, and second via holes of the shadow mask 100, to form a RED organic luminescent layer 110a.

Figure 4E:
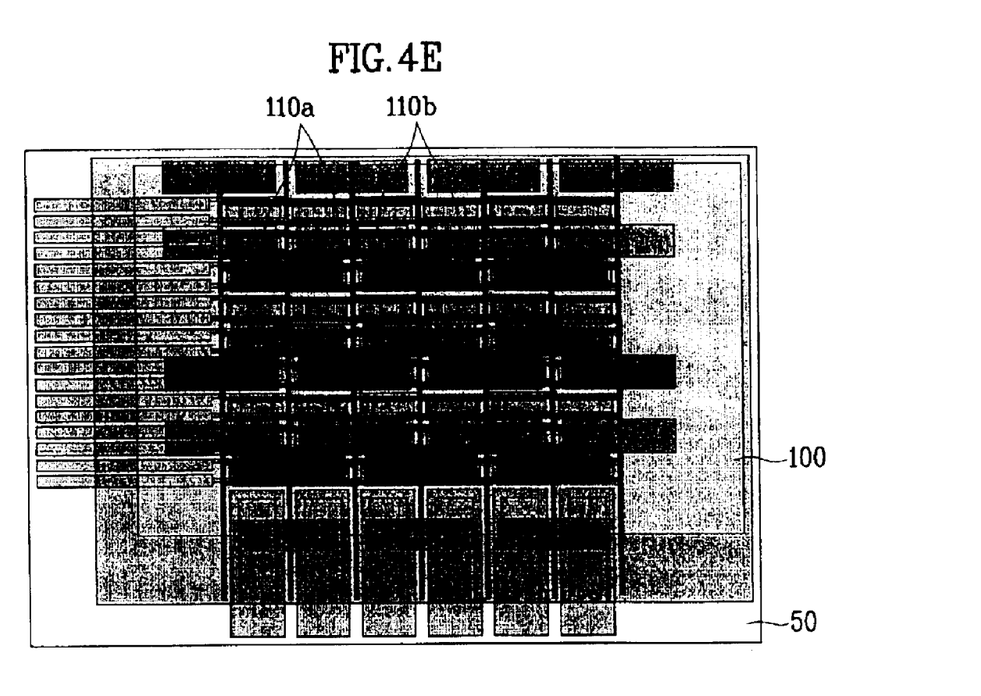

Referring to FIG. 4E, the shadow mask 100 is shifted and placed such that the first and second via holes of the shadow mask 100 are disposed opposite to, and over the GREEN pixel regions. Then, a GREEN light emitting material is deposited on the GREEN pixel regions through the first, and second via holes of the shadow mask 100, to form a GREEN organic luminescent layer 110b.

Figure 4F:
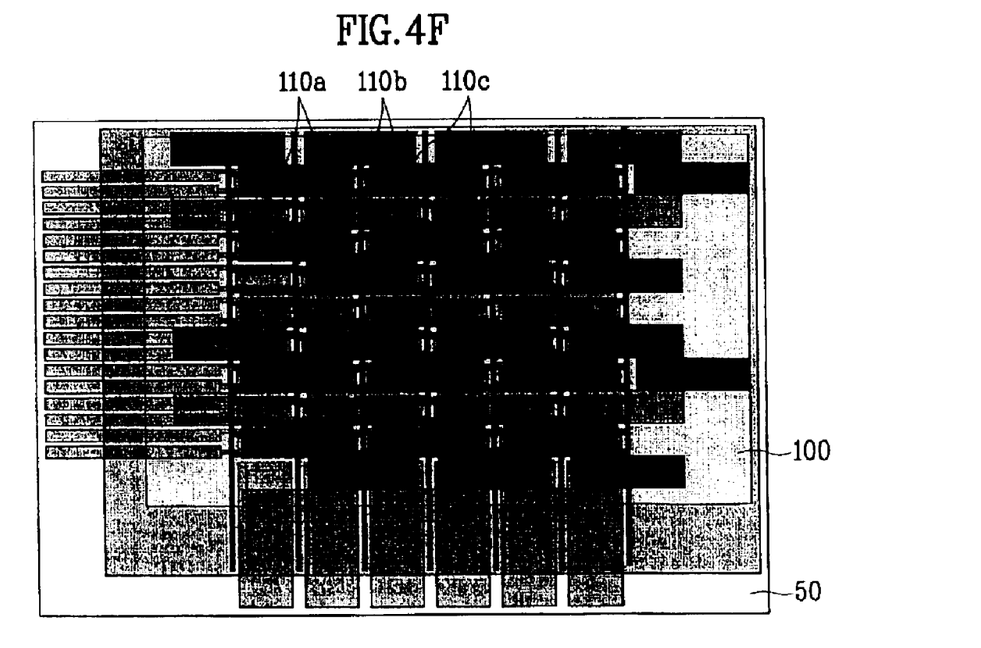

Referring to FIG. 4F, the shadow mask 100 is shifted and placed such that the first and second via holes of the shadow mask 100 are disposed opposite to, and over the BLUE pixel regions. Then, a BLUE light emitting material is deposited on the BLUE pixel regions through the first, and second via holes of the shadow mask 100, to form a BLUE organic luminescent layer 110c.

Figure 4G:
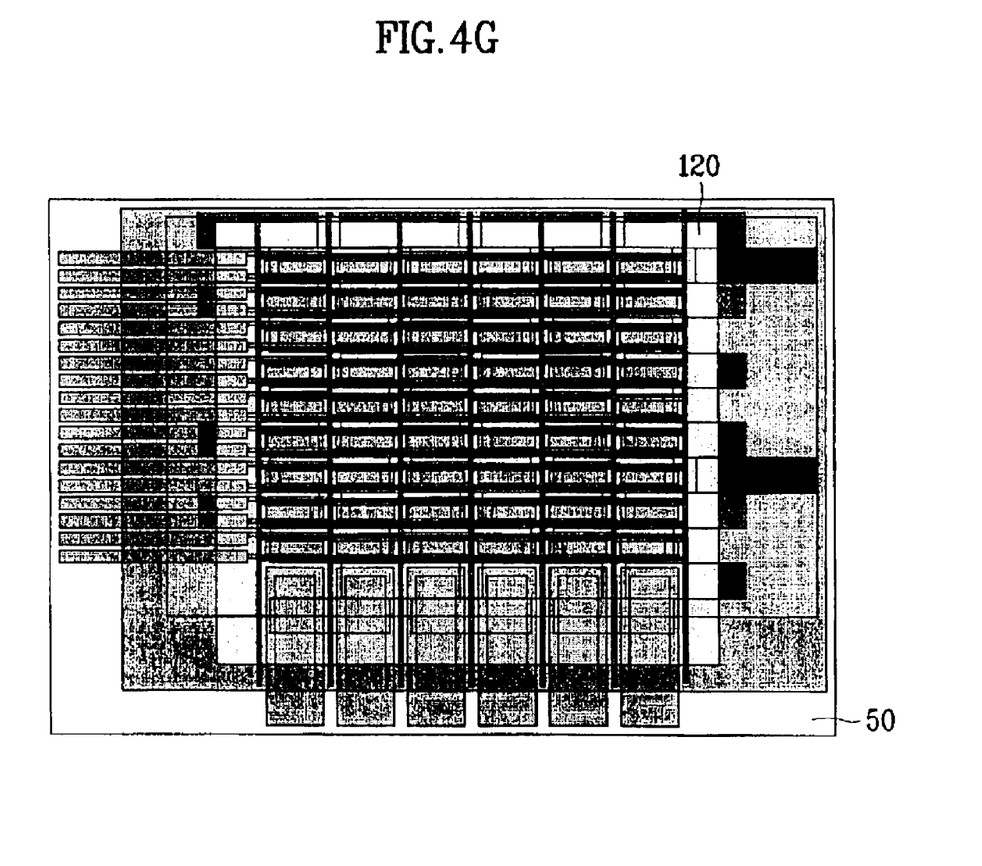

Referring to FIG. 4G, the shadow mask 100 is removed, a second electrode material is formed on an entire surface of the substrate 50, and the second electrodes 120 are formed perpendicular to the first electrodes 60.

Finally, a protection film is formed on the second electrode 120, and a whole display is encapsulated.

Figure 5:
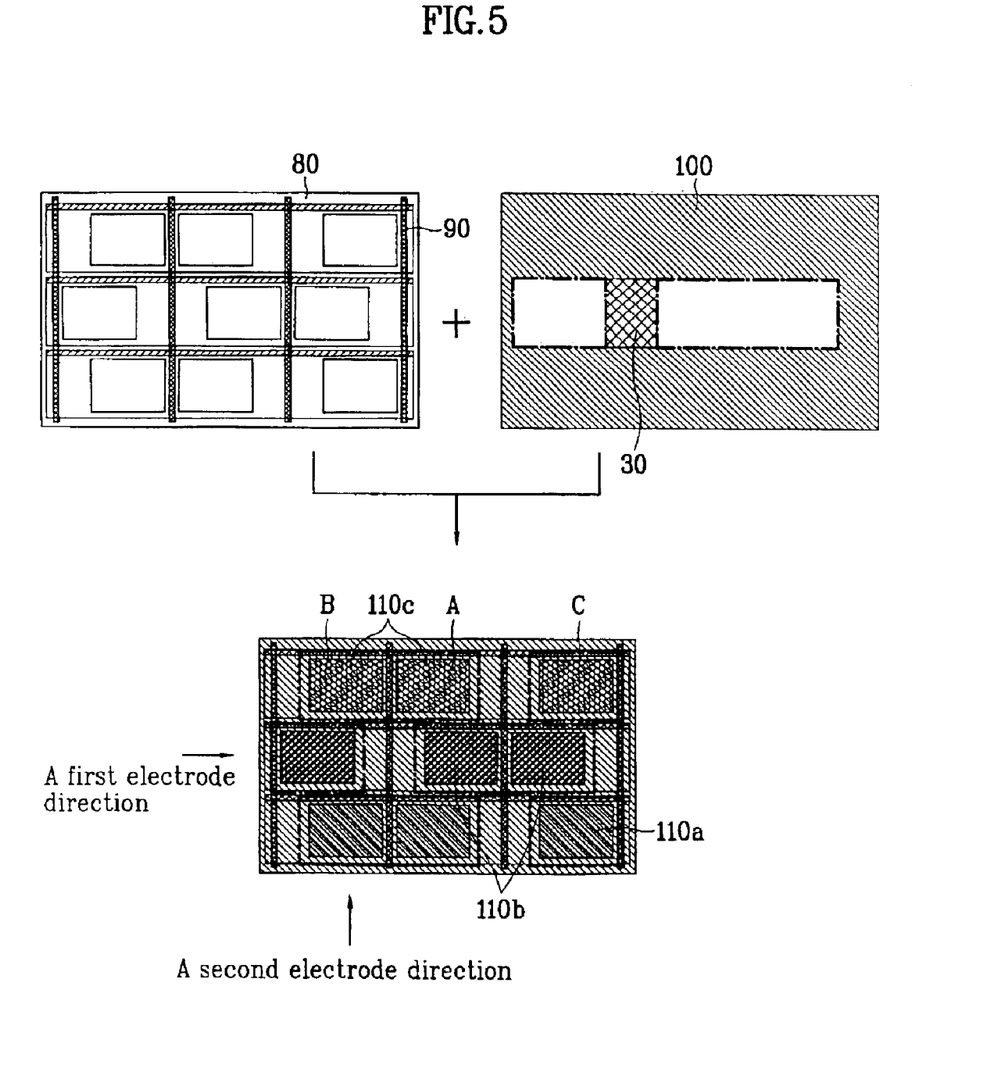
FIG. 5 illustrates pixels of a display matched to openings in a shadow mask.

Referring to FIG. 5, the display fabricated by using the shadow mask of the present invention has pixels formed at different intervals in a first electrode direction and pixels formed at the same intervals in a second electrode direction. The pixels formed in the first electrode direction have identical colors, and the pixels formed in the second electrode direction have different colors. That is, the pixels are formed in the first electrode direction such that a distance of a pixel to an adjacent pixel on one side of the pixel is different from a distance of the pixel to an adjacent pixel on the other side of the pixel. Referring to FIG. 5, a distance between a pixel 'A' and a pixel 'C' adjacent to the pixel 'A' on one side thereof in the first electrode strip direction is approx. 1~1000 $\mu$m, and a distance between the pixel 'A' and a pixel 'B' adjacent to the pixel 'A' on the other side thereof in the first electrode strip direction is approx. below 1 $\mu$m.

As has been explained, the shadow mask, flat display fabricated by using the same, and method for fabricating the flat display of the present invention have the following advantages.

The capability of prevention of deformation and sagging caused by tension of the shadow mask of the present invention can improve a reliability in fabrication of the display.

The fabrication of a display by using the shadow mask of the present invention permits to provide a display having a greater aperture, and has a simple fabrication process.

It will be apparent to those skilled in the art that various modifications and variations can be made in the shadow mask, the flat display fabricated by using the same, and the method for fabricating a flat display of the present invention without departing from the spirit or scope of the invention. Thus, it is intended that the present invention cover the modifications and variations of this invention provided they come within the scope of the appended claims and their equivalents.

What is claimed is:

1. A shadow mask for fabricating a flat display, comprising:
    a substrate;
    a plurality of via holes formed in the substrate on a plurality of rows, comprising;
        first via holes formed in odd numbered rows, and second via holes formed in even numbered rows, wherein the first via holes are shifted in a row direction with respect to the second via holes; and
        bridges formed between adjacent first via holes, and between adjacent second via holes;
    wherein the first and second via holes have substantially the same row direction lengths and substantially the same column direction lengths.

2. A shadow mask as claimed in claim 1, wherein each of the first and second via holes have lengths in a row direction greater than a column direction.

3. A shadow mask as claimed in claim 1, wherein each of the first and second via holes have a row direction length that is equal to two times a row direction length of a pixel of the flat display.

4. A shadow mask as claimed in claim 1, wherein a distance between adjacent odd and even numbered rows is equal to twice a column direction length of a pixel of the flat display.

5. A shadow mask as claimed in claim 1, wherein a distance between adjacent even numbered rows is equal to five times a column direction length of a pixel of the flat display.

6. A shadow mask as claimed in claim 1, wherein a distance between adjacent odd numbered rows is equal to five times a column direction length of a pixel of the flat display.

7. A shadow mask as claimed in claim 1, wherein the bridge prevents deformation of the substrate.

8. A shadow mask as claimed in claim 1, wherein the bridge is formed of a metal.

9. A shadow mask as claimed in claim 1, wherein a thickness of the bridge is equal to a thickness of the substrate, and wherein the bridge and the substrate are formed on a common plane.

10. A shadow mask as claimed in claim 1, wherein a thickness of the bridge is different than a thickness of the substrate, and wherein the bridge and the substrate are positioned on different planes.

11. A shadow mask as claimed in claim 10, wherein the thickness of the bridge is greater than the thickness of the substrate.

12. A shadow mask as claimed in claim 10, wherein the bridge comprises;
    a first sub-bridge having a thickness equal to the thickness of the substrate and formed on the same plane as the substrate, and
    a second sub-bridge formed on the first sub-bridge and the substrate.

13. A shadow mask as claimed in claim 12, wherein the second sub-bridge has a thickness equal to or greater than a thickness of the first sub-bridge.

14. A shadow mask as claimed in claim 1, wherein the bridge is formed on the substrate.

15. A shadow mask as claimed in claim 1, wherein the bridge has a width and a thickness in a range of 1~1000 $\mu$m.

16. A shadow mask as claimed in claim 1, wherein the first via holes are shifted by half the row direction length of the first via holes with respect to the second via holes.

17. A method for fabricating a flat display by using a shadow mask having first via holes on odd numbered rows, and second via holes on even numbered rows, wherein the first via holes are shifted in a row direction with respect to the second via holes, and bridges formed between adjacent first via holes, and between adjacent second via holes, the method comprising the steps of:
    providing a substrate;
    forming a plurality of first electrode strips on the substrate in parallel;
    placing the shadow mask such that the first and second via holes are disposed over first pixel regions of the substrate;

forming a first light emitting material in the first pixel regions of the substrate through the first and second via holes;

shifting and placing the shadow mask such that the first and second via holes are disposed over second pixel regions of the substrate;

forming a second light emitting material in the second pixel regions of the substrate through the first and second via holes;

shifting and placing the shadow mask such that the first and second via holes are disposed over third pixel regions of the substrate;

forming a third light emitting material in the third pixel regions of the substrate through the first and second via holes; and forming second electrode strips on the first, second, and third light emitting materials in a direction perpendicular to the first electrode strips.

18. A method as claimed in claim 17, wherein, when the shadow mask is placed over a pixel region, each of the via holes of the shadow mask is over two pixels.

19. A flat display fabricated by using a shadow mask having first via holes on odd numbered rows, and second via holes on even numbered rows, wherein the first via holes are shifted in a row direction with respect to the second via holes, and bridges formed between adjacent first via holes, and between adjacent second via holes, the flat display comprising:

a substrate;

a plurality of first electrode strips formed on the substrate in parallel;

a plurality of second electrode strips formed in a direction perpendicular to the first electrode strips; and light emitting pixels containing light emitting materials formed in regions where the first electrode strips and the second electrode strips cross, wherein the light emitting pixels formed in a direction of the first electrode strips are formed at different intervals, and the light emitting pixels formed in a direction of the second electrode strips are formed at the same intervals.

20. A flat display as claimed in claim 19, wherein each of the light emitting pixels formed in the direction of the first electrode strips is spaced from an adjacent light emitting pixel on a first side thereof by a distance that is different than a distance from an adjacent light emitting pixel on a second side thereof.

21. A flat display as claimed in claim 20, wherein the distance to an adjacent light emitting pixel on the first side thereof in the direction of the first electrode strips is 1~1000 μm, and the distance to an adjacent light emitting pixel on the second side thereof in the direction of the first electrode strips is below 1 μm.

22. A shadow mask for fabricating a flat display, comprising:

a substrate;

a plurality of first via holes formed in odd numbered rows;

a plurality of second via holes formed in even numbered rows, wherein the second via holes are shifted in a row direction with respect to the first via holes; and first bridges formed between adjacent first via holes; and second bridges formed between adjacent second via holes;

wherein the first and second via holes have substantially the same row direction lengths and substantially the same column direction lengths, and wherein the first and second bridges are positioned on a different plane than the substrate, and have a common thickness that is different than a thickness of the substrate.

23. The shadow mask of claim 22, wherein the thickness of the first and second bridges is greater than the thickness of the substrate.

24. A shadow mask for fabricating a flat display, comprising:

a substrate;

a plurality of first via holes formed in odd numbered rows;

a plurality of second via holes formed in even numbered rows, wherein the second via holes are shifted in a row direction with respect to the first via holes; and first bridge formed between adjacent first via holes; and second bridge formed between adjacent second via holes;

wherein each of the first and second via holes have substantially the same row direction lengths and substantially the same column direction lengths, and wherein the first and second bridges are formed on the substrate.

25. A shadow mask for fabricating a flat display, comprising:

a substrate;

a plurality of first via holes formed in odd numbered rows;

a plurality of second via holes formed in even numbered rows, wherein the second via holes are shifted in a row direction with respect to the first via holes, and wherein each of the first and second via holes have substantially the same row direction lengths and substantially the same column direction lengths; and first bridges formed between adjacent first via holes; and second bridges formed between adjacent second via holes, wherein the first and second bridges each comprise, a first sub-bridge having a thickness equal to a thickness of the substrate, and a second sub-bridge formed on the first sub-bridge and the substrate.

* * * * *